United States Patent
Tanaka

(10) Patent No.: US 8,383,193 B2
(45) Date of Patent: Feb. 26, 2013

(54) FILM FORMATION METHOD AND METHOD FOR MANUFACTURING LIGHT-EMITTING ELEMENT

(75) Inventor: Koichiro Tanaka, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 451 days.

(21) Appl. No.: 12/629,710

(22) Filed: Dec. 2, 2009

(65) Prior Publication Data

US 2010/0143610 A1  Jun. 10, 2010

(30) Foreign Application Priority Data

Dec. 5, 2008 (JP) ................................. 2008-310491

(51) Int. Cl.
- *B05D 5/06* (2006.01)
- *B05D 5/00* (2006.01)
- *H05B 6/00* (2006.01)
- *G03C 8/00* (2006.01)

(52) U.S. Cl. ........... 427/66; 427/256; 427/595; 430/200

(58) Field of Classification Search ............ 427/66, 427/595, 596, 256; 430/200, 201, 252–254
See application file for complete search history.

(56) References Cited

U.S. PATENT DOCUMENTS

| | | | |
|---|---|---|---|
| 6,688,365 B2 | 2/2004 | Tyan et al. | |
| 6,695,029 B2 | 2/2004 | Phillips et al. | |
| 6,703,179 B2 | 3/2004 | Tyan | |
| 6,767,743 B2 | 7/2004 | Takayama et al. | |
| 6,929,048 B2 | 8/2005 | Phillips | |
| 7,470,933 B2 | 12/2008 | Lee et al. | |
| 2001/0000744 A1* | 5/2001 | Wolk et al. ..................... | 430/200 |
| 2001/0003612 A1* | 6/2001 | Sogabe et al. ................ | 428/195 |
| 2007/0111117 A1 | 5/2007 | Noh et al. | |
| 2008/0003519 A1* | 1/2008 | Felder et al. .................. | 430/200 |
| 2009/0166563 A1 | 7/2009 | Yokoyama et al. | |
| 2009/0197017 A1 | 8/2009 | Tanaka et al. | |
| 2009/0218219 A1 | 9/2009 | Yamazaki | |
| 2009/0220706 A1 | 9/2009 | Yamazaki et al. | |
| 2009/0221107 A1 | 9/2009 | Yamazaki et al. | |
| 2009/0226631 A1 | 9/2009 | Yamazaki et al. | |

(Continued)

FOREIGN PATENT DOCUMENTS

| | | |
|---|---|---|
| EP | 0 851 714 A2 | 7/1998 |
| EP | 1 321 303 A1 | 6/2003 |

(Continued)

*Primary Examiner* — James Lin
(74) *Attorney, Agent, or Firm* — Husch Blackwell LLP

(57) ABSTRACT

There is a problem in a method for forming an EL layer by heating with light and transferring an organic material in that the organic material is not uniformly transferred. The present invention relates to a film formation method including the steps of forming a metal film over a first surface of an elastic substrate; forming an organic material layer onto a second surface of the elastic substrate which is opposite to the first surface; placing the second surface of the elastic substrate and a substrate on which a film is to be formed, with a space between the second surface of the elastic substrate and the substrate on which a film is to be formed; heating locally and rapidly the metal film from a first surface side of the elastic substrate to deform the elastic substrate by expansion of the metal film; and transferring the organic material layer from the elastic substrate onto the substrate on which a film is to be formed.

20 Claims, 6 Drawing Sheets

U.S. PATENT DOCUMENTS

| | | |
|---|---|---|
| 2009/0226637 A1 | 9/2009 | Yamazaki |
| 2009/0233006 A1 | 9/2009 | Yamazaki et al. |
| 2009/0256169 A1 | 10/2009 | Yokoyama et al. |
| 2009/0258167 A1 | 10/2009 | Tanaka |
| 2009/0269485 A1 | 10/2009 | Ikeda et al. |
| 2009/0269509 A1 | 10/2009 | Yokoyama et al. |

FOREIGN PATENT DOCUMENTS

| | | |
|---|---|---|
| EP | 1 321 988 A2 | 6/2003 |
| EP | 1 344 652 A2 | 9/2003 |
| JP | 10-208881 | 8/1998 |
| JP | 2002-272460 | 9/2002 |
| JP | 2003-197372 | 7/2003 |
| JP | 2003-223991 | 8/2003 |
| JP | 2003-308974 | 10/2003 |
| JP | 2004-103406 | 4/2004 |
| JP | 2006-5328 | 1/2006 |
| JP | 2007-504621 | 3/2007 |

* cited by examiner

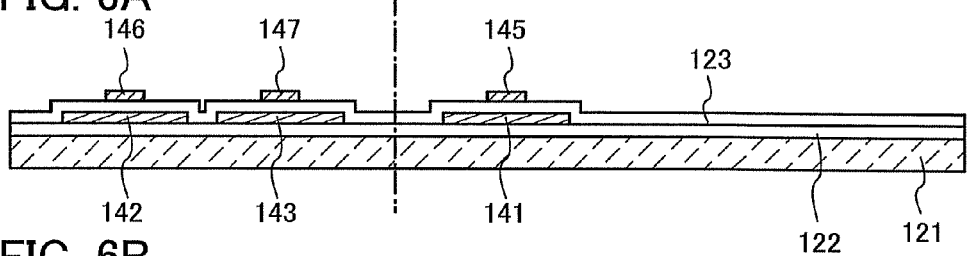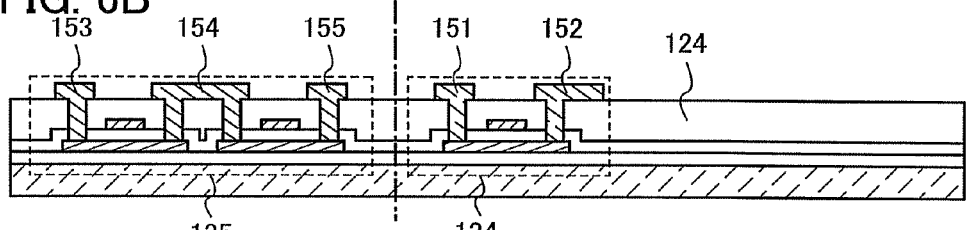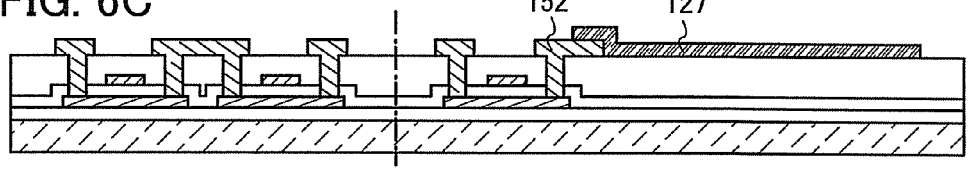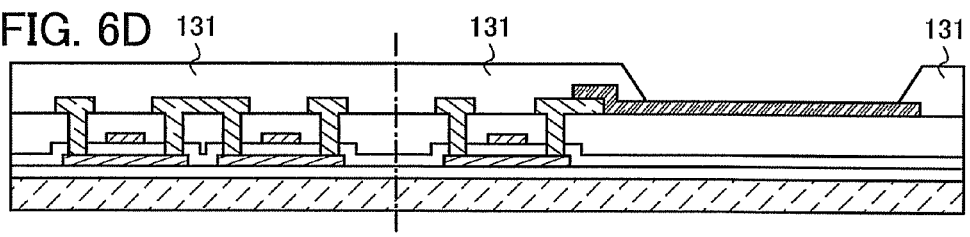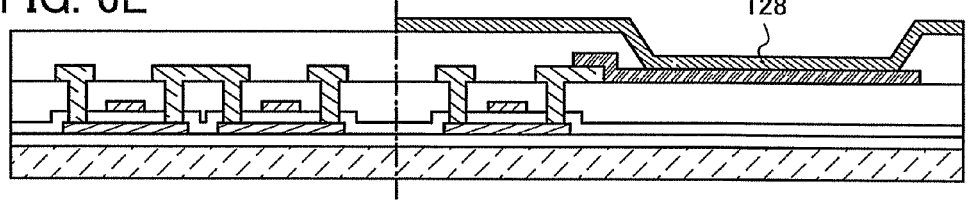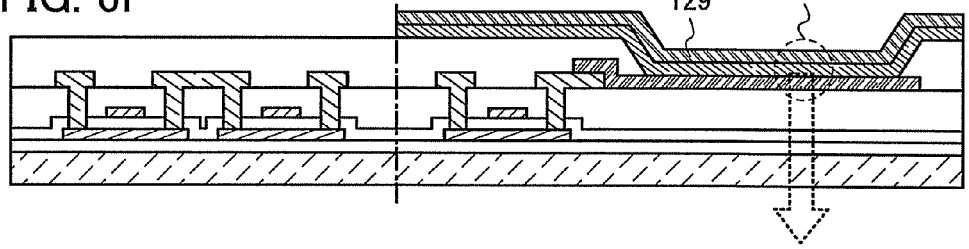

FILM FORMATION METHOD AND METHOD FOR MANUFACTURING LIGHT-EMITTING ELEMENT

BACKGROUND OF THE INVENTION

1. Field of the Invention

The present invention disclosed in the present specification relates to a film formation method and a method for manufacturing a light-emitting element.

2. Description of the Related Art

Light-emitting elements using an organic compound as a light emitter, which have features such as thinness, lightweight, fast response, and direct current low voltage driving, have been applied to next-generation flat panel displays.

It is said that, as for a light-emitting mechanism of a light-emitting element, an EL layer (also referred to as a light-emitting layer) is sandwiched between a pair of electrodes and voltage is applied, and thus electrons injected from a cathode and holes injected from an anode are recombined in an emission center of the EL layer to form molecular excitons, and the molecular excitons release energy when returning to a ground state; thus, light is emitted.

As one of methods for forming an EL layer, a technique is developed. In that technique, an organic material which is an EL material is uniformly deposited on a substrate that is referred to as a donor, and the donor on which the organic material is deposited is placed over/under an another substrate and irradiated with a laser beam, and an organic thin film (an EL layer of a light-emitting element) in a region irradiated with the laser beam is transferred to the another substrate (see References 1 to 5). As such a technique of laser transfer, laser-induced pattern-wise sublimation (LIPS), laser-induced thermal imaging (LITI) (see Reference 6), and radiation induced sublimation transfer (RIST) are proposed.

Further, it is known that, onto one surface of metal foil, short pulse energy which is absorbed and causes vaporization and plasmatization of the metal, for example light energy including laser light, is applied; thus, a jet is generated by a sudden expansion of a metal gas and a shock wave is generated on the other surface of the metal foil (see Patent Document 7).

In Patent Document 7, the following is known. That is, short pulse energy such as a Q-switch laser beam emitted to metal foil induces ablation, and, as a result of its reaction, a shock wave is generated in the metal foil. The shock wave is reflected on the other surface of the metal foil as an expansion wave; thus, the metal foil is deformed at extremely high speed, and micro particles on the metal foil are blasted off at extremely high speed.

[Reference]

Reference 1: Japanese Translation of PCT International Application No. 2007-504621
Reference 2: Japanese Published Patent Application No. 2003-223991
Reference 3: Japanese Published Patent Application No. 2003-308974
Reference 4: Japanese Published Patent Application No. 2003-197372
Reference 5: Japanese Published Patent Application No. H10-208881
Reference 6: Japanese Published Patent Application No. 2006-5328
Reference 7: Japanese Published Patent Application No. 2002-272460

There are problems in a method for forming an EL layer by heating and transferring an organic material which is an EL material in that an edge portion of the EL layer has a small thickness and the organic material is not uniformly transferred.

SUMMARY OF THE INVENTION

A metal film is formed over an elastic substrate, and an organic material to be transferred is deposited onto a surface of the elastic substrate which is opposite to a surface thereof where the metal film is formed. Laser irradiation is performed on the side of the metal film not contacting with the elastic substrate, whereby the metal film is instantaneously subjected to high temperatures and a shock wave is generated. The shock wave propagates in the metal film and is reflected as an expansion wave on the interface with the elastic substrate. Thus, the metal film is instantaneously deformed. By the deformation of the metal film, the elastic substrate is also deformed.

Due to the deformation of the elastic substrate, the deposited organic material is separated rapidly. A transfer receiving substrate is placed in a direction the organic material is separated; thus, the organic material which is rapidly separated adheres to the transfer receiving substrate. Accordingly, the organic material is transferred onto the transfer receiving substrate.

The present invention disclosed in the present specification relates to a film formation method including the steps of forming a metal film over a first surface of an elastic substrate; forming an organic material layer onto a second surface of the elastic substrate which is opposite to the first surface of the elastic substrate; placing the second surface of the elastic substrate and a substrate on which a film is to be formed, so as to face each other with a space between the second surface of the elastic substrate and the substrate on which a film is to be formed; heating locally and rapidly the metal film from a first surface side of the elastic substrate to deform the elastic substrate by expansion of the metal film; and transferring the organic material layer from the elastic substrate onto the substrate on which a film is to be formed.

The present invention disclosed in the present specification relates to a film formation method including the steps of forming a first electrode; forming a metal film over a first surface of an elastic substrate; forming an organic material layer onto a second surface of the elastic substrate which is opposite to the first surface of the elastic substrate; placing the second surface of the elastic substrate and the first electrode so as to face each other with a space between the second surface of the elastic substrate and the first electrode; heating locally and rapidly the metal film from a first surface side of the elastic substrate to deform the elastic substrate by expansion of the metal film; transferring the organic material layer from the elastic substrate onto the first electrode; and forming a second electrode onto the organic material layer transferred.

The metal film is heated by means for locally and densely applying light energy or electrical energy.

The elastic substrate is a substrate which is deformed by application of external force and returns to its original shape by release of the external force.

The organic material layer is formed using a plurality of layers of different materials and compositions or formed using a plurality of layers of different materials or compositions.

The organic material layer includes at least one kind selected from a light-emitting layer, an electron-injecting layer, an electron-transporting layer, a hole-injecting layer, and a hole-transporting layer.

The organic material is separated with high directivity, and thus, a film of the organic material with a uniform thickness can be transferred.

The organic material is separated by deforming the elastic substrate; therefore, a stack film can be transferred at a time.

BRIEF DESCRIPTION OF THE DRAWINGS

FIGS. 6A to 6F are cross-sectional views illustrating a method for manufacturing a light-emitting device.

DETAILED DESCRIPTION OF THE INVENTION

Figure 1A:
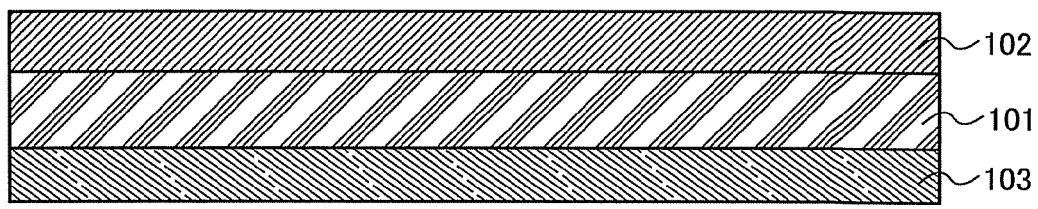
FIGS. 1A to 1C are cross-sectional views illustrating a film formation method.

Embodiments of the present invention disclosed in the present specification will be described below with reference to drawings. However, the present invention disclosed in the present specification can be implemented in various different modes, and it is easily understood by those skilled in the art that various changes and modifications of the modes and details are possible without departing from the purpose and scope of the present invention disclosed in the present specification. Therefore, the present invention disclosed in the present specification is not construed as being limited to the description of the Embodiments. Note that the same portion or a portion having the same function is denoted by the same reference numeral in drawings below, and the repetitive explanation thereof is omitted.

Note that in the present specification, a semiconductor device refers to an element or a device in general which functions by utilizing a semiconductor. Electric devices including electric circuits, liquid crystal display devices, light-emitting devices, and the like and electronic equipments on which the electric devices are mounted are included in the category of semiconductor devices.

Embodiment 1

This embodiment is described with reference to FIGS. 1A to 1C, FIGS. 2A to 2C, FIG. 3, FIGS. 4A and 4B, and FIGS. 5A to 5C.

A metal film 102 is formed over an elastic substrate 101. Further, an organic material 103 is deposited onto a surface of the elastic substrate 101 which is opposite to a surface thereof where the metal film 102 is formed (see FIG. 1A). The organic material 103 is an EL material which includes at least one of a material for a light-emitting layer, a material for an electron-injecting layer, a material for an electron-transporting layer, a material for a hole-injecting layer, and a material for a hole-transporting layer. Note that a buffer layer may be provided between the elastic substrate 101 and the organic material 103. As the elastic substrate 101, a substrate which is deformed by application of external force and returns to its original shape by release of the external force is used, and in addition, a material in which a shock wave propagates is used.

As the elastic substrate 101, for example, a rubber substrate, a resin substrate, or the like may be used. As materials for a rubber substrate, natural rubber, synthetic rubber, and the like can be given.

As synthetic rubber, the following can be given: acrylic rubber, acrylonitrile-butadiene rubber (nitrile rubber), isoprene rubber, urethane rubber, ethylene-propylene rubber, epichlorohydrin rubber, chloroprene rubber, silicone rubber, styrene-butadiene rubber, butadiene rubber, fluorine rubber, polyisobutylene rubber (butyl rubber), and the like.

As materials for a resin substrate, a thermosetting resin, a thermoplastic resin, and the like can be given.

As a thermosetting resin, the following can be given: a phenol resin, an epoxy resin, a melamine resin, a urea resin, an unsaturated polyester resin, an alkyd resin, polyurethane, a thermosetting polyimide, and the like.

As a thermoplastic resin, a commodity plastic, an engineering plastic, a super engineering plastic, and the like can be given.

As a commodity plastic, polyethylene (including high-density polyethylene, medium density polyethylene, and low-density polyethylene), polypropylene, poly(vinyl chloride) (including poly(vinylidene chloride)), polystyrene, poly(vinyl acetate), polytetrafluoroethylene, an ABS resin (acrylonitrile-butadiene-styrene resin), an AS resin, an acrylic resin, and the like can be given.

As an engineering plastic, polyamide (including nylon), polyacetal, polycarbonate, modified polyphenylene ether, polybutylene terephthalate, polyethylene terephthalate, glass fiber reinforced polyethylene terephthalate, cyclic polyolefin, and the like can be given.

As a super engineering plastic, polyphenylenesulfide, polytetrafluoroethylene, polysulfone, polyethersulfone, polyarylate-PAR, liquid crystal polymer, polyether ether ketone, thermoplastic polyimide, polyamide-imide, and the like can be given.

As one kind of composite materials using a synthetic resin, fiber reinforced plastics are given. As typical examples of fiber reinforced plastics, glass fiber reinforced plastics (GFRP) and carbon fiber reinforced plastics (CFRP) are given.

Note that the thickness of the elastic substrate 101 may be 10 μm to 1 mm, the thickness of the metal film 102 may be 1 nm to 1 μm, and the thickness of the organic material 103 may be 10 nm to 300 nm.

Figure 1B:
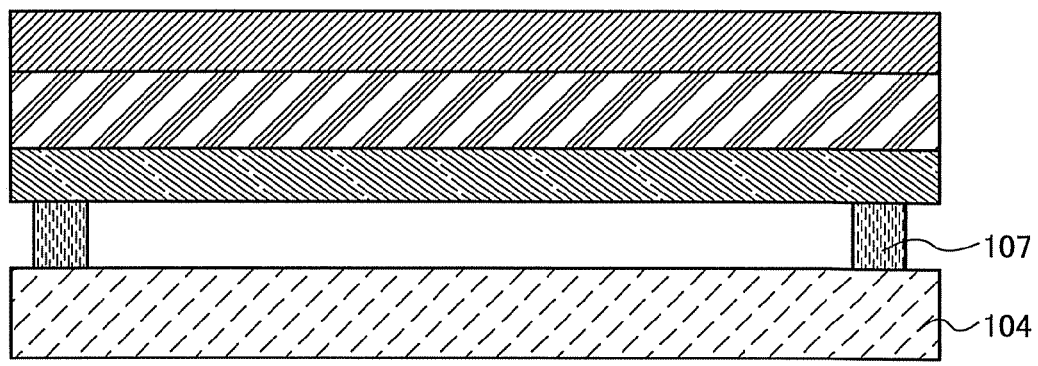

The elastic substrate 101 is fixed in such a manner that the surface of the elastic substrate 101 where the organic material 103 is deposited, faces a transfer receiving substrate 104 with a space of several tens of micrometers to several hundreds of micrometers between the elastic substrate 101 and the transfer receiving substrate 104 (see FIG. 1B).

The transfer receiving substrate 104 whose surface is covered with an organic material is useful because it facilitates deposition of an organic layer 111, which is part of the organic material 103 and is separated.

At this time, a space between the organic material 103 and the transfer receiving substrate 104 is sealed with a sealing material 107 in a vacuum state. Thus, when the organic material 103 is transferred, the organic material 103 transferred can be prevented from being partly thinned. Moreover, impurity contamination can be prevented. In a vacuum state, the mean free path is long; therefore, molecules of a film to be transferred travel in straight lines without being scattered. Accordingly, the organic material 103 transferred can be prevented from being partly thinned.

Figure 1C:
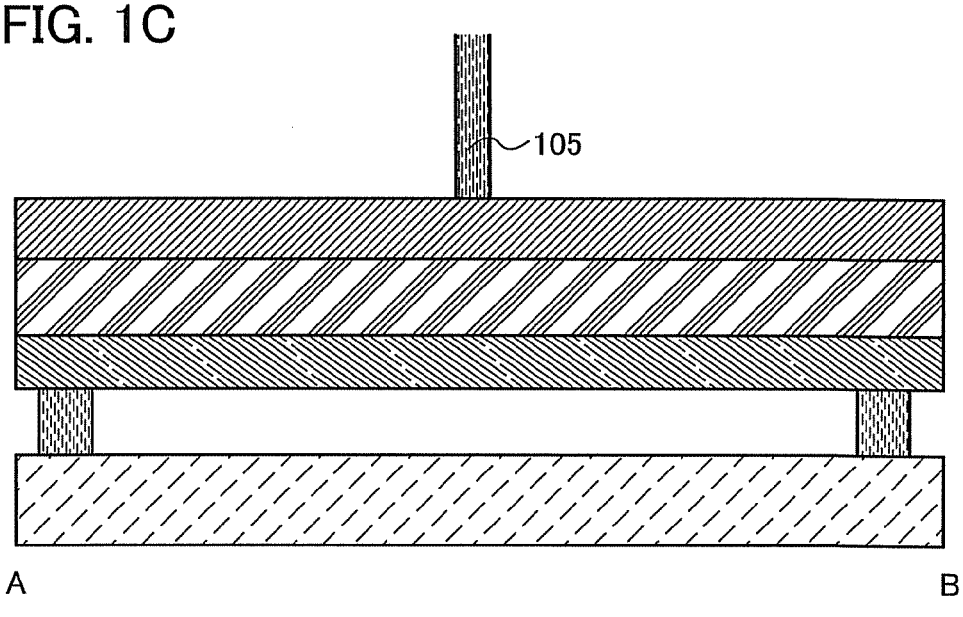

Next, the metal film 102 is irradiated with light, for example, a laser beam 105 (see FIG. 1C). Note that FIG. 1C corresponds to a cross-sectional view taken along the line A-B in FIG. 3 which is described below. As a light source, a laser is preferable; however, a light source other than a laser may be used as long as a shock wave is generated by local heating of the metal film 102.

For example, a probe may be brought close to the metal film 102 and thus a pulsed discharge (arc discharge) may be generated to locally and instantaneously heat the metal film 102, whereby a shock wave may be generated.

As the laser, a Q-switch laser or a pulsed laser other than the Q-switch laser, such as an excimer layer, may be used. When light is emitted from a Q-switch laser, a surface of the metal film 102 is instantaneously exposed to ultra high temperatures by high energy storage (see FIG. 2A). A jet of metal plasma is discharged in a direction opposite to a direction of irradiation with the laser beam 105. As a result of its reaction, a shock wave 108 propagates in the metal film 102 (see FIG. 2B). At this time, when the power distribution of the laser beam 105 is uniform, the power of the shock wave 108 is also uniform.

The shock wave propagating in the metal film 102 is reflected as an expansion wave on the interface with the elastic substrate 101 on a rear surface. Thus, the metal film 102 is deformed instantaneously. The expansion of the metal film 102 reaches the elastic substrate 101, and therefore, the elastic substrate 101 is also deformed instantaneously.

Figure 2A:
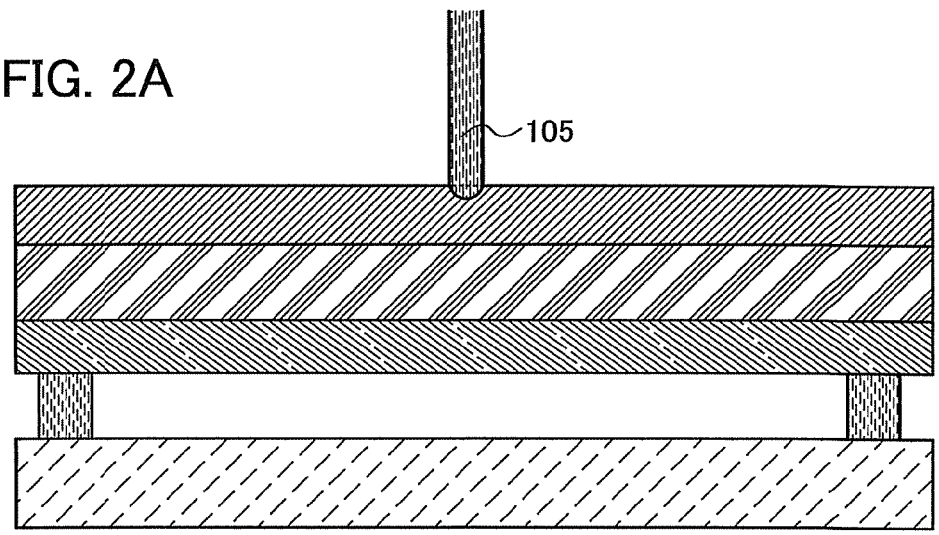
FIGS. 2A to 2C are cross-sectional views illustrating the film formation method.
Figure 2B:
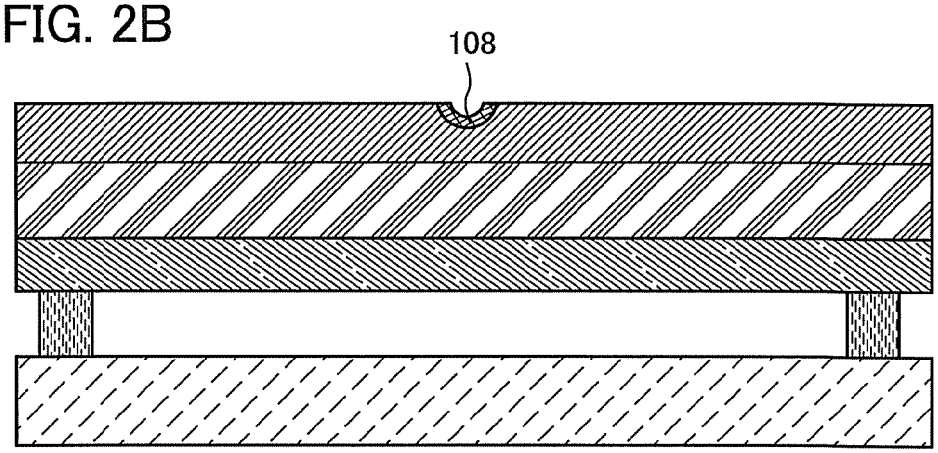
Figure 2C:
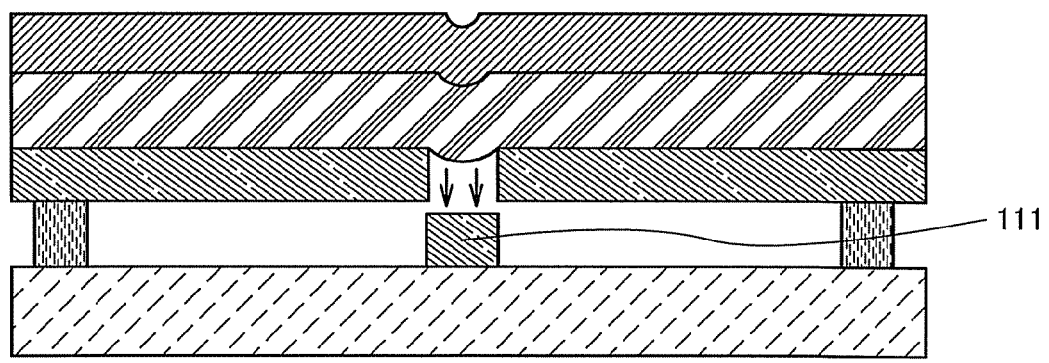

Accordingly, the organic layer 111, which is part of the organic material 103 deposited on the surface of the elastic substrate 101 which is opposite to the surface of the elastic substrate 101 where the metal film 102 is formed, is separated rapidly and transferred onto the transfer receiving substrate 104 which is kept at a distance (see FIG. 2C).

Figure 3:
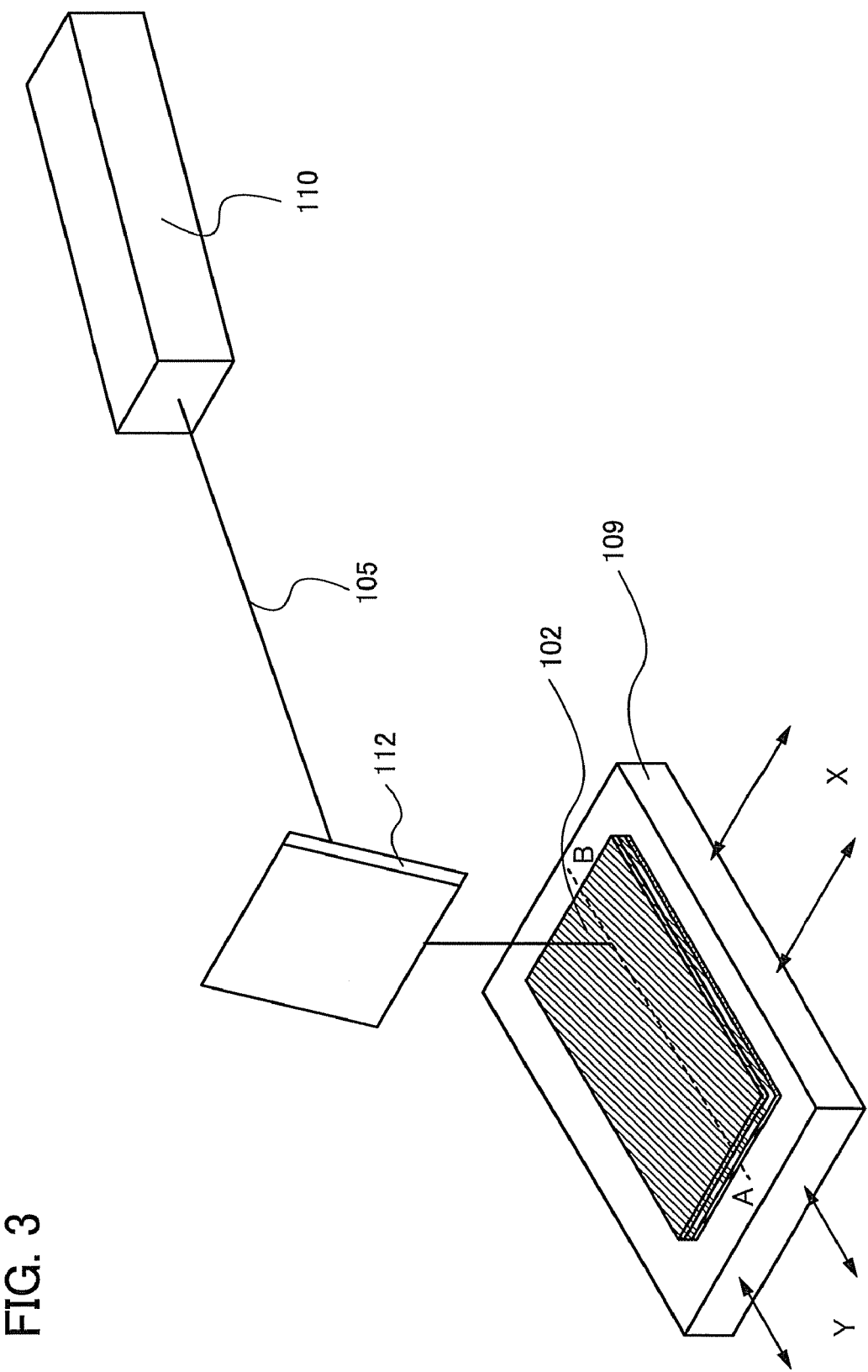
FIG. 3 is a perspective view illustrating a laser irradiation method.

By placing the elastic substrate 101 and the transfer receiving substrate 104 onto a stage 109 which is scanned in the X direction and the Y direction, an entire surface of the metal film 102 can be irradiated with the laser beam 105 which is oscillated from a laser 110 and is reflected by a mirror 112 (see FIG. 3).

When the metal film 102 is formed into a desired shape, the organic material 103 in a region without the metal film 102 is not transferred because the elastic substrate 101 in the region is not deformed. On the other hand, the organic material 103 in a region with the metal film 102 can be transferred and thus the organic layer 111 having the desired shape can be transferred onto the transfer receiving substrate 104 (see FIG. 4A).

Figure 4A:
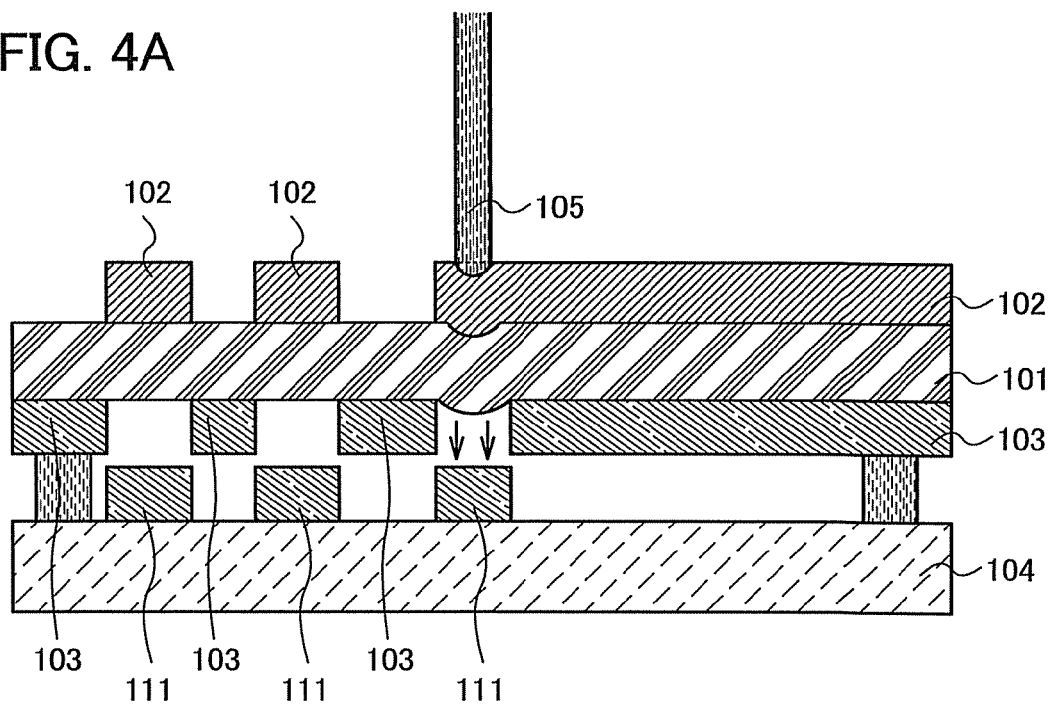
FIGS. 4A and 4B are cross-sectional views each illustrating a film formation method.
Figure 4B:
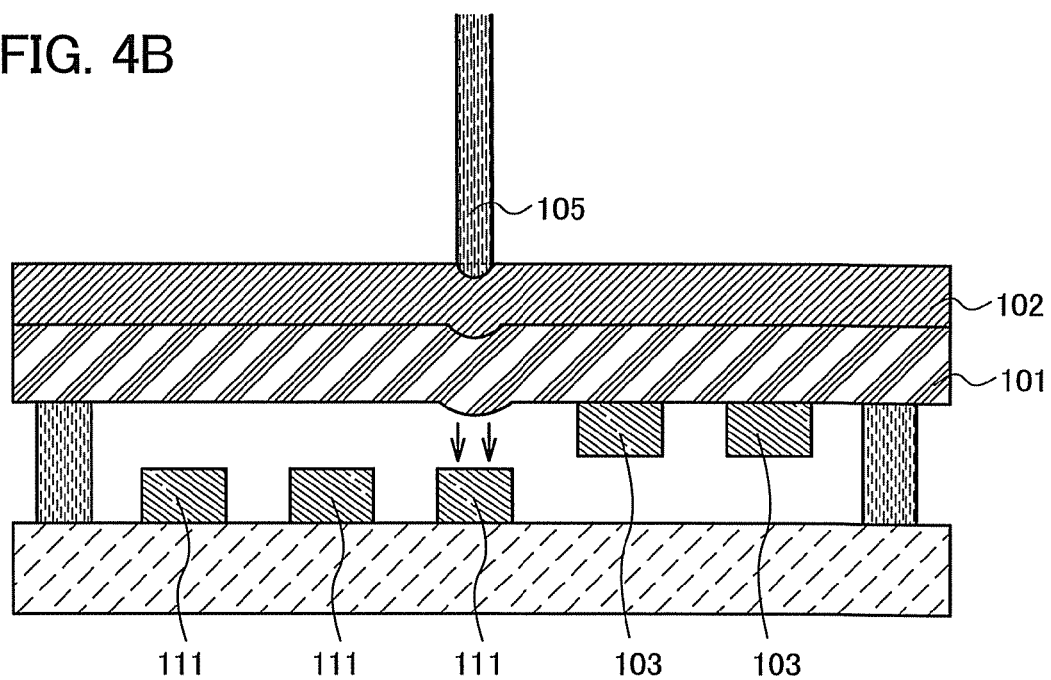

Alternatively, when the organic material 103 is formed into a desired shape, the organic layer 111 having the desired shape is transferred onto the transfer receiving substrate 104 (see FIG. 4B).

Figure 5A:
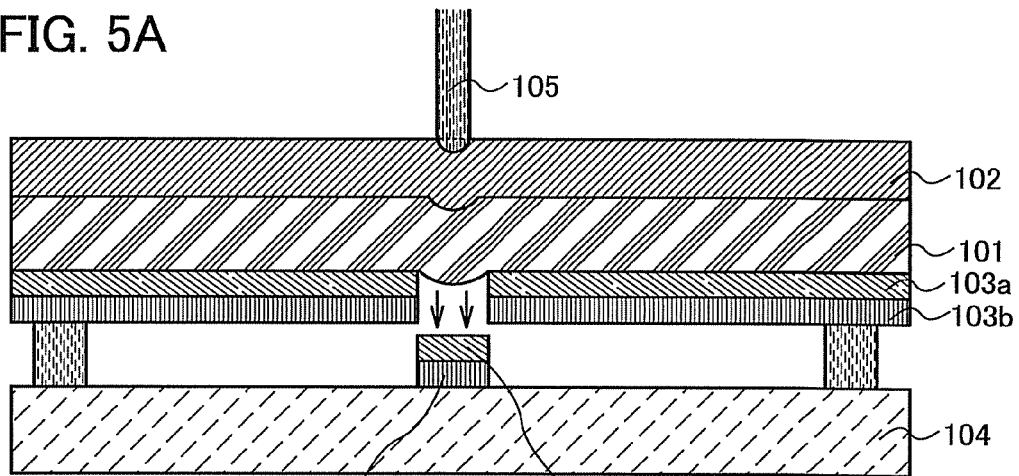
FIGS. 5A to 5C are cross-sectional views each illustrating a film formation method.
Figure 5B:
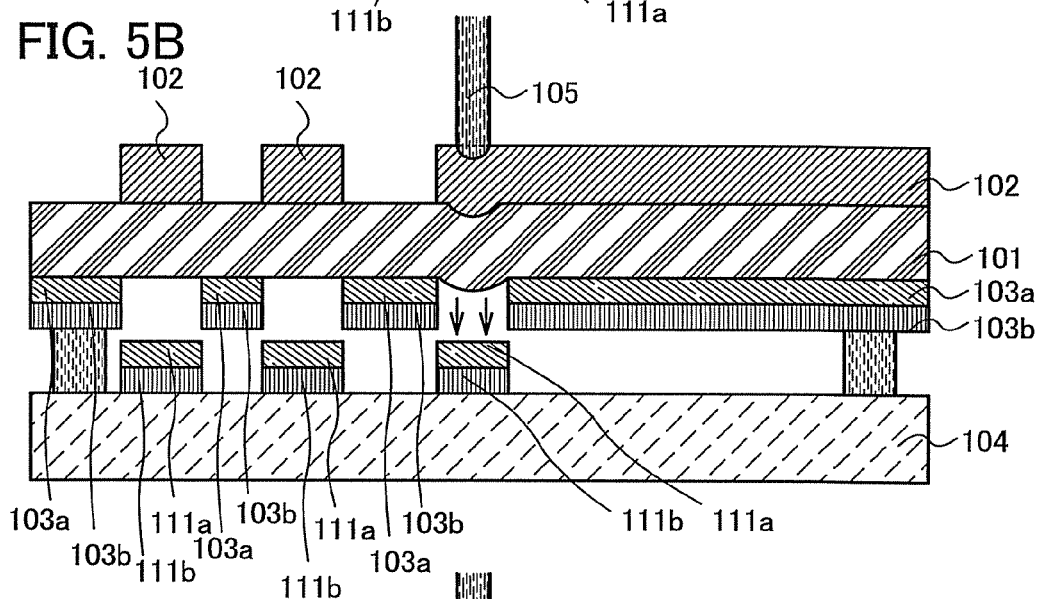
Figure 5C:
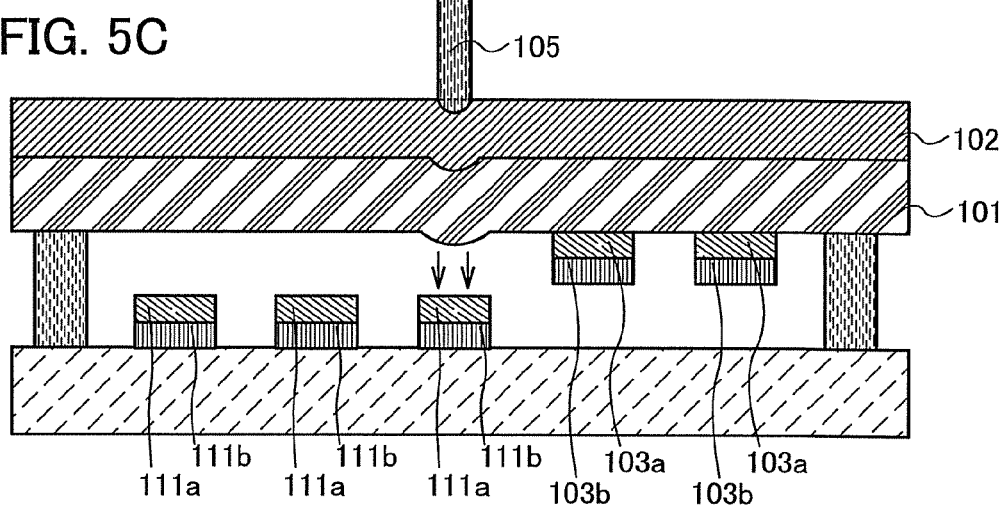

Further, a stack film may be formed as the organic material 103 by stacking a first organic material 103a and a second organic material 103b, and the stack film may be transferred onto the transfer receiving substrate 104 at a time, so that a stack film including a second organic layer 111b and a first organic layer 111a may be formed onto the transfer receiving substrate 104 (see FIG. 5A). Furthermore, a stack film formed as the organic material 103 may be transferred onto the transfer receiving substrate 104 by the method shown in FIG. 4A (see FIG. 5B) or the method shown in FIG. 4B (see FIG. 5C), so that the organic layer 111, which is a stack film having a desired shape, may be formed onto the transfer receiving substrate 104.

For example, when the first organic material 103a is used for the light-emitting layer and the second organic material 103b is used for the electron-injecting layer as illustrated in FIG. 5A, both the second organic layer 111b, which is the electron-injecting layer, and the first organic layer 111a, which is the light-emitting layer, can be formed onto the transfer receiving substrate 104 at a time.

A method for manufacturing a light-emitting element by using the above-described film formation method is described below with reference to FIGS. 6A to 6F.

First, a base film 122 is formed over a substrate 121 having a light-transmitting property. The substrate 121 having a light-transmitting property may be a glass substrate or a quartz substrate, for example. The base film 122 may be formed using any one of a silicon oxide film, a silicon nitride film, a silicon nitride film including oxygen, or a silicon oxide film including nitrogen, or a stack film in which two or more films selected from a silicon oxide film, a silicon nitride film, a silicon nitride film including oxygen, or a silicon oxide film including nitrogen are stacked.

An island-like semiconductor film 141, an island-like semiconductor film 142, and an island-like semiconductor film 143 are formed over the base film 122. To obtain the island-like semiconductor film 141, the island-like semiconductor film 142, and the island-like semiconductor film 143, a semiconductor film may be formed over the base film 122 and the semiconductor film may be etched using a mask so that the semiconductor film is formed into island-like shapes.

The semiconductor film can be formed using any of the following materials: an amorphous semiconductor manufactured by a vapor-phase growth method or a sputtering method using a semiconductor source typified by silane or germane; a polycrystalline semiconductor formed by crystallizing the amorphous semiconductor with the use of light energy or thermal energy; a microcrystalline (also referred to as semi-amorphous or microcrystal) semiconductor (hereinafter also referred to as "SAS"); a semiconductor containing an organic material as its main component; and the like. The semiconductor film can be formed by a sputtering method, an LPCVD method, a plasma CVD method, or the like.

The microcrystalline semiconductor film belongs to an intermediate metastable state between an amorphous semiconductor and a single crystal semiconductor when Gibbs free energy is considered. That is, the microcrystalline semiconductor film is a semiconductor film having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is shifted to a wave number lower than 520 cm$^{-1}$, which represents a peak of the Raman spectrum of single crystal silicon. That is, the peak of the Raman spectrum of the microcrystalline silicon exists between 520 cm$^{-1}$ which represents single crystal silicon and 480 cm$^{-1}$ which represents amorphous silicon. The microcrystalline silicon contains hydrogen or halogen of at least 1 at.% to terminate dangling bonds. Moreover, microcrystalline semiconductor film is made to contain a rare gas element such as helium, argon, krypton, or neon to further enhance its lattice distortion, whereby stability is increased and a favorable microcrystalline semiconductor film can be obtained.

This microcrystalline semiconductor film can be formed by a high-frequency plasma CVD method with a frequency of several tens of MHz to several hundreds of MHz or with a microwave plasma CVD apparatus with a frequency of greater than or equal to 1 GHz. Typically, the microcrystalline semiconductor film can be formed with a dilution of silicon hydride such as $SiH_4$, $Si_2H_6$, $SiH_2Cl_2$, $SiHCl_3$, $SiCl_4$, or $SiF_4$ with hydrogen. Further, in addition to silicon hydride and hydrogen, one or plural kinds of rare gas elements selected from helium, argon, krypton, or neon are used for a dilution, so that the microcrystalline semiconductor film can be formed. In that case, the flow ratio of hydrogen to silicon hydride is set to be 5:1 to 200:1, preferably, 50:1 to 150:1, more preferably, 100:1.

As an amorphous semiconductor, hydrogenated amorphous silicon can be typically given, and as a crystalline semiconductor, polysilicon (polycrystalline silicon) or the like can be typically given. Examples of polysilicon (polycrystalline silicon) include so-called high-temperature polysilicon that contains polysilicon which is formed at a process temperature of greater than or equal to 800° C. as its main material, so-called low-temperature polysilicon that contains polysilicon which is formed at a process temperature of less than or equal to 600° C. as its main material, polysilicon obtained by crystallizing amorphous silicon by using an element that promotes crystallization or the like, and the like. It is needless to say that as mentioned above, a microcrystalline semiconductor or a semiconductor containing a crystal phase in part of a semiconductor film can be used.

As a material of the semiconductor, as well as an element such as silicon (Si) or germanium (Ge), a compound semiconductor such as GaAs, InP, SiC, ZnSe, GaN, or SiGe can be used. Alternatively, an oxide semiconductor such as zinc oxide (ZnO), tin oxide ($SnO_2$), magnesium zinc oxide, gallium oxide, or indium oxide, an oxide semiconductor including two or more of the above oxide semiconductors, or the like can be used. For example, an oxide semiconductor including zinc oxide, indium oxide, and gallium oxide can also be used. In the case of using zinc oxide for the semiconductor film, the gate insulating film is preferably formed of $Y_2O_3$, $Al_2O_3$, or $TiO_2$, a stacked layer thereof, or the like, and the gate electrode, the source electrode, and the drain electrode is preferably formed of indium tin oxide (ITO), gold (Au), titanium (Ti), or the like. In addition, In, Ga, or the like can be added to ZnO.

In the case of using a crystalline semiconductor film for the semiconductor film, the crystalline semiconductor film may be formed by any of various methods (such as a laser crystallization method, a thermal crystallization method, and a thermal crystallization method using an element promoting crystallization, such as nickel). Also, a microcrystalline semiconductor film which is an SAS can be crystallized by being irradiated with laser light to increase its crystallinity. When the element that promotes crystallization is not introduced, prior to irradiating an amorphous silicon film with laser light, the amorphous silicon film is heated at 500° C. for one hour under a nitrogen atmosphere to release hydrogen contained in the amorphous silicon film such that the concentration of hydrogen becomes less than or equal to $1 \times 10^{20}$ atoms/cm$^3$. This is because the amorphous silicon film containing a high amount of hydrogen is destroyed when the amorphous silicon film is irradiated with laser light.

In addition, in a crystallization step in which the amorphous semiconductor film is crystallized to form a crystalline semiconductor film, the crystallization may be performed by adding an element which promotes crystallization (also referred to as a catalyst element or a metal element) to the amorphous semiconductor film and performing heat treatment (at 550° C. to 750° C. for 3 minutes to 24 hours). As the element which promotes (accelerates) the crystallization, one or more of iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used.

A method for introducing a metal element into an amorphous semiconductor film is not limited to a particular method as long as it is a method capable of providing the metal element on a surface or inside of the amorphous semiconductor film. For example, a sputtering method, a CVD method, a plasma processing method (including a plasma CVD method), an adsorption method, or a method for adding a solution of metal salt, can be used. In the above mentioned methods, the method using a solution is simple and has an advantage that the concentration of a metal element can easily be adjusted. In addition, at this time, in order to improve the wettability of the surface of the amorphous semiconductor film to spread an aqueous solution on the entire surface of the amorphous semiconductor film, an oxide film is preferably formed by UV light irradiation in an oxygen atmosphere, a thermal oxidation method, treatment using ozone water containing hydroxyl radical or a hydrogen peroxide solution, or the like.

In order to remove the element which promotes crystallization from the crystalline semiconductor film, a semiconductor film containing an impurity element is formed in contact with the crystalline semiconductor film and is made to function as a gettering sink. As the impurity element, an impurity element imparting n-type conductivity, an impurity element imparting p-type conductivity, a rare gas element, or the like can be used. For example, one or more of phosphorus (P), nitrogen (N), arsenic (As), antimony (Sb), bismuth (Bi), boron (B), helium (He), neon (Ne), argon (Ar), krypton (Kr), and xenon (Xe) can be used. The semiconductor film containing a rare gas element is formed over the crystalline semiconductor film containing an element which promotes crystallization, and heat treatment (at 550° C. to 750° C. for 3 minutes to 24 hours) is performed. The element which promotes crystallization in the crystalline semiconductor film moves into the semiconductor film containing a rare gas element, and the element which promotes crystallization in the crystalline semiconductor film is removed. Then, the semiconductor film containing a rare gas element, which serves as a gettering sink, is removed.

The amorphous semiconductor film may be crystallized by using combination of heat treatment and laser light irradiation. The heat treatment or the laser light irradiation may be carried out several times, separately.

Alternatively, the crystalline semiconductor film may be directly formed over the substrate by a plasma method. Further alternatively, the crystalline semiconductor film may be selectively formed over the substrate by a plasma method.

As the semiconductor film containing an organic material as its main component, a semiconductor film containing, as its main component, a substance which contains a certain amount of carbon or an allotrope of carbon (excluding diamond) in combination with another element can be used. Specifically, pentacene, tetracene, a thiophen oligomer derivative, a phenylene derivative, a phthalocyanine compound, a polyacetylene derivative, a polythiophene derivative, a cyanine dye, and the like can be given.

A gate electrode 145, a gate electrode 146, and a gate electrode 147 are formed over the island-like semiconductor film 141, the island-like semiconductor film 142, and the island-like semiconductor film 143 with a gate insulating film 123 interposed therebetween, respectively (see FIG. 6A).

The gate insulating film 123, the gate electrode 145, the gate electrode 146, and the gate electrode 147 may be formed with a known structure and a known method. For example, the gate insulating film 123 may be formed with a known structure such as a single layer film of silicon oxide or a stack film including silicon oxide and silicon nitride.

The gate electrode 145, the gate electrode 146, and the gate electrode 147 may be formed using any of Ag, Au, Cu, Ni, Pt, Pd, Ir, Rh, W, Al, Ta, Mo, Cd, Zn, Fe, Ti, Si, Ge, Zr, and Ba; or an alloy material or a compound material containing any of the elements as its main component by a CVD method, a sputtering method, a droplet discharge method, or the like. In addition, a semiconductor film typified by a polycrystalline silicon film doped with an impurity element such as phosphorus or an AgPdCu alloy may be used. Further, either a single layer structure or a stacked layer structure may be employed.

An impurity element imparting one conductivity type may be added to the island-like semiconductor film 141, the island-like semiconductor film 142, and the island-like semiconductor film 143 using the gate electrode 145, the gate electrode 146, and the gate electrode 147 as a mask, respectively. In the case where an impurity element imparting n-type conductivity is used as an impurity element imparting one conductivity type, phosphorus (P) or arsenic (As) may be used. In the case where an impurity element imparting p-type conductivity is used as an impurity element imparting one conductivity type, boron (B) may be used.

Note that although an example of forming top gate type thin film transistors (TFTs) is described in this embodiment, bottom gate type transistors or transistors with other known structures may be used as a matter of course.

An insulating film 124 is formed so as to cover the gate insulating film 123, the gate electrode 145, the gate electrode 146, and the gate electrode 147. An electrode 151 and an electrode 152 which are electrically connected to the island-like semiconductor film 141, an electrode 153 and an electrode 154 which are electrically connected to the island-like semiconductor film 142, and the electrode 154 and an electrode 155 which are electrically connected to the island-like semiconductor film 143 are formed over the insulating film 124 (see FIG. 6B).

The insulating film 124 is formed using an organic insulating material. As the organic insulating material, acrylic, polyimide, polyamide, polyimide amide, benzocyclobutene, and the like can be given.

The electrode 151, the electrode 152, the electrode 153, the electrode 154, and the electrode 155 may be formed in a manner similar to the gate electrode 145. Note that the electrode 154 is electrically connected to the island-like semiconductor film 142 and the island-like semiconductor film 143. An impurity element imparting n-type conductivity is added to one of the island-like semiconductor film 142 and the island-like semiconductor film 143, and an impurity element imparting p-type conductivity is added to the other of the island-like semiconductor film 142 and the island-like semiconductor film 143, so that a CMOS circuit 135 is formed. The CMOS circuit 135 is included in a basic structure of a driver circuit.

An impurity element imparting n-type conductivity or an impurity element imparting p-type conductivity is added to the island-like semiconductor film 141, so that a TFT 134 is formed. A pixel circuit is formed using the TFT 134.

Next, an electrode 127 which is electrically connected to the electrode 152 of the TFT 134 is formed over the insulating film 124 (see FIG. 6C).

The electrode 127 is a first electrode of a light-emitting element 137. When the electrode 127 is an anode, indium oxide ($In_2O_3$), an alloy of indium oxide and tin oxide ($In_2O_3$—$SnO_2$; ITO), or the like can be used as a material of a transparent conductive film, and the electrode 127 can be formed by a sputtering method, a vacuum evaporation method, or the like. Alternatively, an alloy of indium oxide and zinc oxide ($In_2O_3$—ZnO) may be used. In addition, zinc oxide (ZnO) is also an appropriate material, and moreover, zinc oxide to which gallium (Ga) is added (ZnO:Ga) to increase conductivity and transmissivity of visible light with respect to visible light, or the like can be used.

When the electrode 127 is a cathode, an extremely thin film of a material with a low work function such as aluminum can be used. Alternatively, a stacked layer structure which has a thin film of such a substance and the above-mentioned transparent conductive film can be employed.

Next, an insulating film 131 is formed using an organic insulating material so as to cover the insulating film 124 and the electrode 127. Further, the insulating film 131 is processed so that a surface of the electrode 127 is exposed and an edge portion of the electrode 127 is covered. A region of the insulating film 131 which covers the edge portion of the electrode 127 is referred to as a partition wall (see FIG. 6D). The insulating film 131 is not necessarily present over the CMOS circuit 135.

Next, a light-emitting layer 128 is formed over the insulating film 131 and the electrode 127 (see FIG. 6E). The light-emitting layer 128 may be formed using any of processes illustrated in FIGS. 1A to 1C, FIGS. 2A to 2C, FIG. 3, and FIGS. 4A and 4B. That is, the light-emitting layer 128 may be formed using the organic material 103, and, instead of being transferred onto the transfer receiving substrate 104, the organic material 103 may be transferred onto the electrode 127 to form the light-emitting layer 128.

There is no particular limitation on a stacked layer structure of the light-emitting layer 128. A layer containing a substance having a high electron-transporting property, a layer containing a substance having a high hole-transporting property, a layer containing a substance having a high electron-injecting property, a layer containing a substance having a high hole-injecting property, a layer containing a bipolar substance (a substance having a high electron-transporting property and a high hole-transporting property), and the like may be appropriately combined.

Note that in the present specification, the light-emitting layer 128 indicates a single layer of a light-emitting layer or a stacked layer including a light-emitting layer and any one of a hole-injecting layer, a hole-transporting layer, an electron-transporting layer, and an electron-injecting layer.

For example, an appropriate combination of any of a hole-injecting layer, a hole-transporting layer, a light-emitting layer, an electron-transporting layer, an electron-injecting layer, and the like can be formed as the light-emitting layer 128. In this embodiment, a structure is described in which the light-emitting layer 128 includes a hole-injecting layer, a hole-transporting layer, a light-emitting layer, an electron-transporting layer, and an electron-injecting layer. Specific materials to form each of the layers are given below.

The hole-injecting layer is a layer that is provided in contact with an anode and contains a substance with a high hole-injecting property. Specifically, molybdenum oxide, vanadium oxide, ruthenium oxide, tungsten oxide, manganese oxide, or the like can be used. Alternatively, the hole-injecting layer can also be formed using any of the following materials: a phthalocyanine compound such as phthalocyanine (abbreviation: $H_2Pc$) or copper phthalocyanine (CuPc); an aromatic amine compound such as 4,4'-bis[N-(4-diphenylaminophenyl)-N-phenylamino]biphenyl (abbreviation: DPAB) or 4,4'-bis(N-{4-[N-(3-methylphenyl)-N-phenylamino]phenyl}-N-phenylamino)biphenyl (abbreviation: DNTPD); a high-molecular compound such as polyethylenedioxythiophene/polystyrenesulfonic acid (PEDOT/PSS); and the like.

Alternatively, as the hole-injecting layer, a composite material containing a substance with a high hole-transporting property and an acceptor substance can be used. Note that, by using the composite material containing the substance with a high hole-transporting property and the acceptor substance, a material used to form an electrode can be selected regardless of its work function. In other words, besides a material with a high work function, a material with a low work function can also be used as the electrode 127. As the acceptor substance, 7,7,8,8-tetracyano-2,3,5,6-tetrafluoroquinodimethane (abbreviation: $F_4$-TCNQ), chloranil, and the like can be given. In addition, a transition metal oxide can be given. In addition, oxides of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable because of their high electron-accepting properties. Among these metal oxides, molybdenum oxide is preferable since it can be easily treated due to its stability in the air and low hygroscopic property.

As the substance having a high hole-transporting property used for the composite material, any of various compounds such as an aromatic amine compound, a carbazole derivative, aromatic hydrocarbon, and a high-molecular compound (such as oligomer, dendrimer, or polymer) can be used. Note that the organic compound used for the composite material is preferably an organic compound having a high hole-transporting property. Specifically, a substance having a hole mobility of greater than or equal to $10^{-6}$ cm$^2$/Vs is preferably used. However, other substances than these substances may also be used as long as a hole-transporting property thereof is higher than an electron-transporting property thereof. The organic compound that can be used for the composite material is specifically shown below.

Examples of the aromatic amine compounds include N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), 4,4'-bis(N-{4-[N-(3-methylphenyl)-N-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), and the like.

Examples of the carbazole derivatives which can be used for the composite material include 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphtyl)-N-(9-phenylcarbazol-3-yl)amino]-9-phenylcarbazole (abbreviation: PCzPCN1), and the like.

In addition, examples of the carbazole derivatives which can be used for the composite material include 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, and the like.

Examples of the aromatic hydrocarbon which can be used for the composite material include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. As well as these compounds, pentacene, coronene, or the like can be used. As described above, use of an aromatic hydrocarbon which has a hole mobility of greater than or equal to $1 \times 10^{-6}$ cm$^2$/Vs and has 14 to 42 carbon atoms is more preferable.

The aromatic hydrocarbon that can be used for the composite material may have a vinyl skeleton. As an aromatic hydrocarbon having a vinyl group, for example, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like can be given.

High-molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), poly[N,N'-bis(4-butylphenyl)-N,N'-bis(phenyl)benzidine](abbreviation: Poly-TPD), and the like can also be used.

The hole-transporting layer is a layer that contains a substance with a high hole-transporting property. Examples of the substance having a high hole-transporting property include aromatic amine compounds such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), and the like. The substances described here are mainly substances having a hole mobility of greater than or equal to $10^{-6}$ cm$^2$/Vs. However, a substance other than the above-described substances may also be used as long as a hole-transporting property thereof is higher than an electron-transporting property thereof. Note that the layer containing the substance with a high hole-transporting property is not limited to a single layer, and two or more layers containing the aforementioned substances may be stacked.

Further, a high-molecular compound such as poly(N-vinylcarbazole) (abbreviation: PVK) or poly(4-vinyltriphenylamine) (abbreviation: PVTPA) can also be used for the hole-transporting layer.

The light-emitting layer is a layer containing a light-emitting substance. The light-emitting layer may be a so-called single light-emitting layer containing a light-emitting center substance as its main component or a so-called host-guest type light-emitting layer in which a light-emitting center substance is dispersed in a host material.

There is no particular limitation on the light-emitting center substance that is used, and known fluorescent materials or phosphorescent materials can be used. As fluorescent materials, for example, in addition to N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), and the like, there are fluorescent materials with an emission wavelength of greater than or equal to 450 nm, such as 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N'-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H- carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-α]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), and 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM). As phosphorescent materials, for example, in addition to bis[2-(4',6'-difluorophenyl)pyridinato-N,C$^{2'}$]iridium(III)tetrakis(1-pyrazolyl)borate (abbreviation: FIr6) and the like, there are phosphorescent materials with an emission wavelength in the range of 470 nm to 500 nm, such as bis[2-(4',6'-difluorophenyl)pyridinato-N,C$^{2'}$]iridium(III)picolinate (abbreviation: FIrpic), bis[2-(3',5'-bistrifluoromethylphenyl)pyridinato-N,C$^{2'}$]iridium(III)picolinate (abbreviation: Ir(CF$_3$ppy)$_2$(pic)), and bis[2-(4',6'-difluorophenyl)pyridinato-N,C$^{2'}$]iridium(III)acetylacetonate (abbreviation: FIracac); phosphorescent materials with an emission wavelength of greater than or equal to 500 nm (materials which emit green light), such as tris(2-phenylpyridinato)iridium(III) (abbreviation: Ir(ppy)$_3$), bis(2-phenylpyridinato)iridium(III)acetylacetonate (abbreviation: Ir(ppy)$_2$(acac)), tris(acetylacetonato)(monophenanthroline)terbium(II) (abbreviation: Tb(acac)$_3$(Phen)), bis(benzo[h]quinolinato)iridium(III)acetylacetonate (abbreviation: Ir(bzq)$_2$(acac)), bis(2,4-diphenyl-1,3-oxazolato-N,C$^{2'}$)iridium(III)acetylacetonate (abbreviation: Ir(dpo)$_2$(acac)), bis[2-(4'-perfluorophenylphenyl)pyridinato]iridium(III)acetylacetonate (abbreviation: Ir(p-PF-ph)$_2$(acac)), bis(2-phenylbenzothiazolato-N,C$^{2'}$)iridium(III)acetylacetonate (abbreviation: Ir(bt)$_2$(acac)), bis[2-(2'-benzo[4,5-α]thienyl)pyridinato-N, C$^{3'}$]iridium(III)acetylacetonate (abbreviation: Ir(btp)$_2$(acac)), bis(1-phenylisoquinolinato-N,C$^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), 2,3,7,8,12,13,17,18-octaethyl-21H,23H-porphyrinatoplatinum(II) (abbreviation: PtOEP), tris(1,3-diphenyl-1,3-propanedionato)(monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)); and the like. The light-emitting substances can be selected from the above-mentioned materials or other known materials in consideration of the emission color of each of the light-emitting elements.

When the host material is used, for example, the following can be given: metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)-tris(1-phenyl-1H-benzimidazole) (abbreviation: TPBI), bathophenanthroline (abbreviation: BPhen), bathocuproine (abbreviation: BCP), and 9-[4-(5-phenyl-1,3,4-oxadiazol-2-yl)phenyl]-9H-carbazole (abbreviation: CO11); and aromatic amine compounds such as NPB (or α-NPD), TPD, and BSPB. In addition, condensed polycyclic aromatic compounds such as anthracene derivatives, phenanthrene derivatives, pyrene derivatives, chrysene derivatives, and dibenzo[g,p]chrysene derivatives are given. The following is specifically given as the condensed polycyclic aromatic compound: 9,10-diphenylanthracene (abbreviation: DPAnth); N,N-diphenyl-9-[4-(10-phenyl-9-anthryl)phenyl]-9H-carbazol-3-amine (abbreviation: CzA1PA); 4-(10-phenyl-9-anthryl)triphenylamine (abbreviation: DPhPA); 4-(9H-carbazol-9-yl)-4'-(10-phenyl-9-anthryl)triphenylamine (abbreviation: YGAPA); N,9-diphenyl-N-[4-(10-phenyl-9-anthryl)phenyl]-9H-carbazol-3-amine (abbreviation: PCAPA); N,9-diphenyl-N-{4-[4-(10-phenyl-9-anthryl)phenyl]phenyl}-9H-carbazol-3-amine (abbreviation: PCAPBA); N,9-diphenyl-N-(9,10-diphenyl-2-anthryl)-9H-carbazol-3-amine (abbreviation: 2PCAPA); 6,12-dimethoxy-5,11-diphenylchrysene, N,N,N',N',N'',N'',N''',N'''-octaphenyldibenzo[g,p]chrysene-2,7,10,15-tetramine (abbreviation: DBC1); 9-[4-(10-phenyl-9-anthryl)phenyl]-9H-carbazole (abbreviation: CzPA); 3,6-diphenyl-9-[4-(10-phenyl-9-antryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3''-(benzene-1,3,5-triyl)tripyrene (abbreviation: TPB3), and the like. From these substances or other known substances, the host material may be selected so that the host material has a larger energy gap (or triplet energy if the light-emitting substance emits phosphorescence) than the light-emitting center substance dispersed in the light-emitting layer and has a carrier-transporting property required for each of the light-emitting layers.

The electron-transporting layer is a layer that contains a substance with a high electron-transporting property. For example, a layer containing a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), or bis(2-methyl-8-quinolinolato)(4-phenylphenolato)aluminum (abbreviation: BAlq) can be used. Alternatively, a metal complex having an oxazole-based or thiazole-based ligand, such as bis[2-(2-hydroxyphenyl) benzoxazolato]zinc (abbreviation: Zn(BOX)$_2$) or bis[2-(2-hydroxyphenyl)benzothiazolato]zinc (abbreviation: Zn(BTZ)$_2$) can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances described here are mainly those having an electron mobility of greater than or equal to $10^{-6}$ cm$^2$/Vs. Note that a substance other than the above substances may also be used as the electron-transporting layer as long as an electron-transporting property thereof is higher than a hole-transporting property thereof.

Further, the electron-transporting layer may be formed as not only a single layer but also as a stacked layer in which two or more layers formed using the above mentioned substances are stacked.

Further, a layer for controlling transport of electrons may be provided between the electron-transporting layer and the light-emitting layer. The layer for controlling transport of electrons is a layer in which a small amount of a substance having a high electron-trapping property is added to a layer containing the above-mentioned substances having a high electron-transporting property. The layer for controlling transport of electrons controls transport of electrons, which enables adjustment of carrier balance. Such a structure is very effective in suppressing a problem (such as shortening of element lifetime) caused by a phenomenon that an electron passes through the light-emitting layer.

Further, an electron-injecting layer may be provided so as to be in contact with the electrode functioning as a cathode. As the electron-injecting layer, an alkali metal, an alkaline earth metal, or a compound thereof, such as lithium fluoride (LiF), cesium fluoride (CsF), calcium fluoride (CaF$_2$), or the like can be employed. For example, a layer which contains both a substance having an electron-transporting property and an alkali metal, an alkaline earth metal, or a compound thereof, e.g., a layer of Alq containing magnesium (Mg), can be used. Note that electrons can be efficiently injected from the electrode 129, which is a second electrode of the light-emitting element 137, by using, as the electron-injecting layer, a layer containing a substance having an electron-transporting property to which an alkali metal or an alkaline earth metal is added.

When the electrode 129 is used as a cathode, a metal, an alloy, an electrically conductive compound, a mixture thereof, or the like having a low work function (specifically, a work function of less than or equal to 3.8 eV), can be used as a substance for the electrode 129. As a specific example of such a cathode material, an element belonging to Group 1 or Group 2 of the periodic table, i.e., an alkali metal such as lithium (Li) or cesium (Cs), an alkaline earth metal such as magnesium (Mg), calcium (Ca), or strontium (Sr), an alloy containing any of these metals (such as MgAg or AlLi), a rare earth metal such as europium (Eu) or ytterbium (Yb), an alloy containing such a rare earth metal, or the like can be used.

However, when the electron-injecting layer is provided between the cathode and the electron-transporting layer, any of a variety of conductive materials such as Al, Ag, ITO, indium oxide-tin oxide containing silicon or silicon oxide, and the like can be used regardless of its work function as the cathode. Films of these conductive materials can be formed by a sputtering method, an ink-jet method, a spin coating method, or the like.

It is preferable that, when the electrode 129 is used as an anode, the second electrode 120 be formed using a metal, an alloy, a conductive compound, a mixture thereof, or the like having a high work function (specifically greater than or equal to 4.0 eV). In specific, an example thereof is indium oxide-tin oxide (ITO: indium tin oxide), indium oxide-tin oxide containing silicon or silicon oxide, indium oxide-zinc oxide (IZO: indium zinc oxide), indium oxide containing tungsten oxide and zinc oxide, or the like. Such conductive metal oxide films are usually formed by a sputtering method, but may also be formed by using a sol-gel method or the like. For example, indium oxide-zinc oxide (IZO) can be formed by a sputtering method using a target in which 1 wt % to 20 wt % of zinc oxide is added to indium oxide. Indium oxide containing tungsten oxide and zinc oxide can be formed by a sputtering method using a target in which 0.5 wt % to 5 wt % of tungsten oxide and 0.1 wt % to 1 wt % of zinc oxide are added to indium oxide. In addition, gold (Au), platinum (Pt), nickel (Ni), tungsten (W), chromium (Cr), molybdenum (Mo), iron (Fe), cobalt (Co), copper (Cu), palladium (Pd), a nitride of a metal material (such as titanium nitride), or the like can be given. By forming the above-mentioned composite material so as to be in contact with the anode, a material for the electrode can be selected regardless of its work function.

Further, as an example of using a high-molecular organic light-emitting material, a polythiophene (PEDOT) film with a thickness of 20 nm may be provided as the hole-injecting layer by a spin coating method, and polyphenylenevinylene (PPV) or a dielectric film of PPV with a thickness of approximately 100 nm may be provided as the light-emitting layer over the PEDOT film. Note that when PPV, which is a n-conjugated polymer, or a PPV derivative is used, an emission wavelength of light can be chosen from emission wavelengths of light ranging in color from red to blue. As the electron-transporting layer and the electron-injecting layer, an inorganic material such as silicon carbide can be used.

In the above-described manner, a light-emitting device including the light-emitting element 137 is manufactured (see FIG. 6F). The light-emitting element 137 emits light in the substrate 121 direction in the following case: the electrode 127 is an electrode having a light-transmitting property; the electrode 129 is an electrode having a light-reflecting property; and the substrate 121 is a substrate having a light-transmitting property.

A separation layer is formed between the substrate 121 and the base film 122, and at the separation layer, a structure over the base film 122 and the substrate 121 are separated from each other. Further, the structure over the base film 122 and a flexible substrate are bonded together with a bonding layer. Accordingly, a light-emitting element can be manufactured over the flexible substrate. In the case where a light-emitting element is manufactured over a flexible substrate, the light-emitting element over the flexible substrate can be combined with electronic devices with various shapes.

This application is based on Japanese Patent Application serial no. 2008-310491 filed with Japan Patent Office on Dec. 5, 2008, the entire contents of which are hereby incorporated by reference.

What is claimed is:

1. A film formation method comprising the steps of:
   forming a metal film over a first surface of an elastic substrate, the elastic substrate consisting of rubber;
   forming an organic material layer onto a second surface of the elastic substrate which is opposite to the first surface of the elastic substrate;
   placing the second surface of the elastic substrate and a substrate, so as to face each other with a space between the second surface of the elastic substrate and the substrate;
   heating locally the metal film from a first surface side of the elastic substrate to deform the elastic substrate by expansion of the metal film; and
   transferring a part of the organic material layer from the elastic substrate onto the substrate due to the deforming.

2. The film formation method according to claim 1, wherein the heating step is performed using means for locally and densely applying light energy or electrical energy.

3. The film formation method according to claim 1, wherein the elastic substrate is a substrate which is deformed by application of external force and returns to its original shape by release of the external force.

4. The film formation method according to claim 1, wherein the rubber comprises at least one of natural rubber and synthetic rubber.

5. The film formation method according to claim 1, wherein the organic material layer is formed using a plurality of layers of different materials and compositions or formed using a plurality of layers of different materials or compositions.

6. The film formation method according to claim 1, wherein the organic material layer includes at least one layer selected from a light-emitting layer, an electron-injecting layer, an electron-transporting layer, a hole-injecting layer, and a hole-transporting layer.

7. The film formation method according to claim 1, wherein the transferring step comprising the steps of:
   separating the part of the organic material layer from the elastic substrate due to the deforming; and
   attaching the part of the organic material layer on the substrate after the separating step.

8. The film formation method according to claim 1, wherein the space is in a vacuum state.

9. The film formation method according to claim 1, further comprising the step of forming the metal film into a desired shape.

10. The film formation method according to claim 1, further comprising the step of forming organic material layer into a desired shape.

11. A method for manufacturing a light-emitting device comprising the steps of:
    forming a first electrode over a substrate;
    forming a metal film over a first surface of an elastic substrate, the elastic substrate consisting of rubber;
    forming an organic material layer onto a second surface of the elastic substrate which is opposite to the first surface of the elastic substrate;
    placing the second surface of the elastic substrate and the first electrode so as to face each other with a space between the second surface of the elastic substrate and the first electrode;
    heating locally the metal film from a first surface side of the elastic substrate to deform the elastic substrate by expansion of the metal film;
    transferring a part of the organic material layer from the elastic substrate onto the first electrode due to the deforming; and
    forming a second electrode onto the organic material layer transferred.

12. The method for manufacturing the light-emitting device according to claim 11, wherein the heating step is performed using means for locally and densely applying light energy or electrical energy.

13. The method for manufacturing the light-emitting device according to claim 11, wherein the elastic substrate is a substrate which is deformed by application of external force and returns to its original shape by release of the external force.

14. The method for manufacturing the light-emitting device according to claim 11, wherein the rubber comprises at least one of natural rubber and synthetic rubber.

15. The method for manufacturing the light-emitting device according to claim 11, wherein the organic material layer is formed using a plurality of layers of different materials and compositions or formed using a plurality of layers of different materials or compositions.

16. The method for manufacturing the light-emitting device according to claim 11, wherein the organic material layer includes at least one layer selected from a light-emitting layer, an electron-injecting layer, an electron-transporting layer, a hole-injecting layer, and a hole-transporting layer.

17. The method for manufacturing a light-emitting device according to claim 11, wherein the transferring step comprising the steps of:
    separating the part of the organic material layer from the elastic substrate due to the deforming; and
    attaching the part of the organic material layer on the substrate after the separating step.

18. The method for manufacturing a light-emitting device according to claim 11, wherein the space is in a vacuum state.

19. The method for manufacturing a light-emitting device according to claim 11, further comprising the step of forming the metal film into a desired shape.

20. The method for manufacturing a light-emitting device according to claim 11, further comprising the step of forming organic material layer into a desired shape.

* * * * *